United States Patent

[11] 3,603,917

[72] Inventor Radford K. Owen
Lynchburg, Va.
[21] Appl. No. 854,623
[22] Filed Sept. 2, 1969
[45] Patented Sept. 7, 1971
[73] Assignee General Electric Company

[54] MOUNTING DEVICE FOR A WOUND INDUCTOR
8 Claims, 4 Drawing Figs.

[52] U.S. Cl. .......... 339/220 C, 339/193 P, 339/276 C
[51] Int. Cl. .......... H01r 13/50
[50] Field of Search .......... 339/176 M, 220, 128, 218 G, 275 A, 276 C, 198.3, 193; 336/192, 208

[56] References Cited

UNITED STATES PATENTS 2,004,610 6/1935 Jones .......... 339/193 S X
2,113,328 4/1938 Makenny .......... 339/176 M X
2,774,949 12/1956 Cardani et al. .......... 339/128
2,863,131 12/1958 Carlzen et al. .......... 339/193 P
2,953,758 9/1960 Stanwyck .......... 336/192 X

*Primary Examiner*—Stephen J. Novosad
*Assistant Examiner*—Robert A. Hafer
*Attorneys*—James J. Williams, Frank L. Neuhauser, Oscar B. Waddell and Joseph B. Forman

ABSTRACT: A mounting device for a wound inductor is provided by an insulating cylindrical member that is open at one end and closed at the other end to form a receptacle for the inductor. The cylindrical member has a plurality of equally spaced slots that extend longitudinally along its inner cylindrical surface to locate terminals that extend longitudinally along its outer cylindrical surface. The inductor is fastened in the receptacle and connected to appropriate terminals at the open end. The terminals extend beyond the closed end and can pass through openings in a printed circuit board for soldering.

INVENTOR:
RADFORD K. OWEN,

BY James J. Williams
HIS ATTORNEY.

MOUNTING DEVICE FOR A WOUND INDUCTOR

BACKGROUND OF THE INVENTION

My invention relates to a mounting device, and particularly to a mounting device for attaching a wound inductor to a printed circuit board.

Inductors form an important part of electronic circuits. If an inductor is to be used in an electronic circuit which is provided on a printed circuit board, the inductor should be relatively small or compact. The inductor leads should be connected to pins or terminals so as to protect the leads and to facilitate connecting the inductor to the printed circuit board. While bases for mounting inductors on printed circuit boards are commercially available, such bases have disadvantages. For example, some bases do not provide enough pins or terminals. Some bases have no choice of pin location. Some bases are too large for use with printed circuit boards. And some bases are difficult to mount and solder to printed circuit boards.

Accordingly, an object of my invention is to provide a new and improved mounting device for a wound inductor.

Another object of my invention is to provide a new and improved device for mounting and connecting a wound inductor to a printed circuit board.

Another object of my invention is to provide an inductor mounting base that can accommodate a relatively large number of pins or terminals at selected locations.

Another object of my invention is to provide an inductor mounting base that is relatively compact, and that is easy to position and solder on a printed circuit board.

SUMMARY OF THE INVENTION

Briefly, these and other objects are achieved in accordance with my invention by a cylindrical member formed of an insulating material such as plastic. The member is open at one end and is closed at the other end to form a receptacle for a wound inductor. The inner surface of the cylindrical member is provided with a plurality of equally spaced, parallel slots that extend longitudinally along the inner surface. These slots provide mounting locations for longitudinal pins or terminals which can be staked to the outer surface of the cylindrical member so as to extend below its closed end. A wound inductor can then be positioned and fastened in the formed receptacle, and the inductor leads connected to the pins at the open end of the member. The member with the inductor is positioned on a printed circuit board so that the pins extend through appropriate holes in the board. The pins can be flow-soldered to the printed circuit board along with other components to provide a new and improved mounting device for an inductor.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENT

Figure 1:
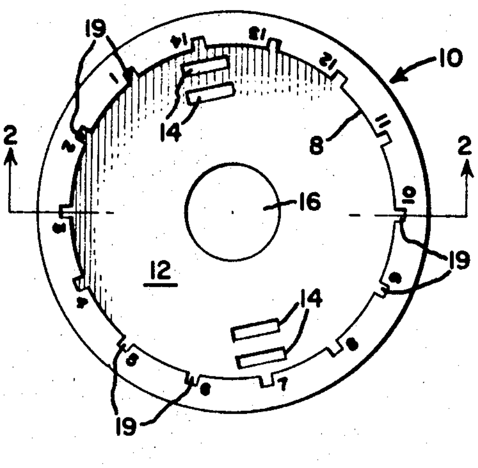
FIG. 1 shows a plan view of a mounting device constructed in accordance with my invention.
Figure 2:
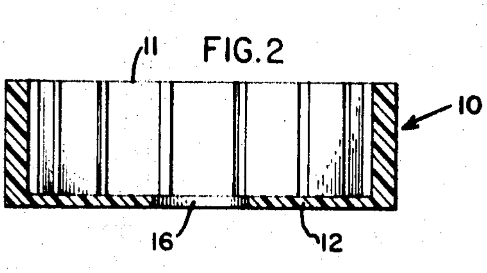
FIG. 2 shows a longitudinal, cross-sectional view of my mounting device taken along the line 2—2 in Fig. 1.

With reference to FIGS. 1 and 2, my mounting device comprises an insulating cylindrical member 10 formed of a suitable insulating material, such as nylon. The cylindrical member

10 is open at its upper end 11, but is closed at its lower end by a circular bottom 12 which may be formed integrally with the cylindrical wall of the member 10. The bottom 12 may have appropriate rectangular holes or slots 14 for receiving mounting tabs of a clip that holds an inductor, as will be explained. The bottom 12 may also be provided with a central hole or opening 16 for receiving a machine screw or bolt for holding an inductor if desired. The inner wall or surface 18 of the cylindrical member 10 is provided with a plurality of equally spaced slots or depressions 19 which are adapted to locate or position mounting pins or terminals, as will be explained. In FIGS. 1 and 2, I have shown 14 such slots 19, but it is to be understood that a greater or lesser number of slots 19 may be provided. The slots 19 have a generally rectangular cross-sectional configuration, and extend longitudinally from the upper end of the cylindrical member 10 to, but not through, the bottom 12.

Figure 3:
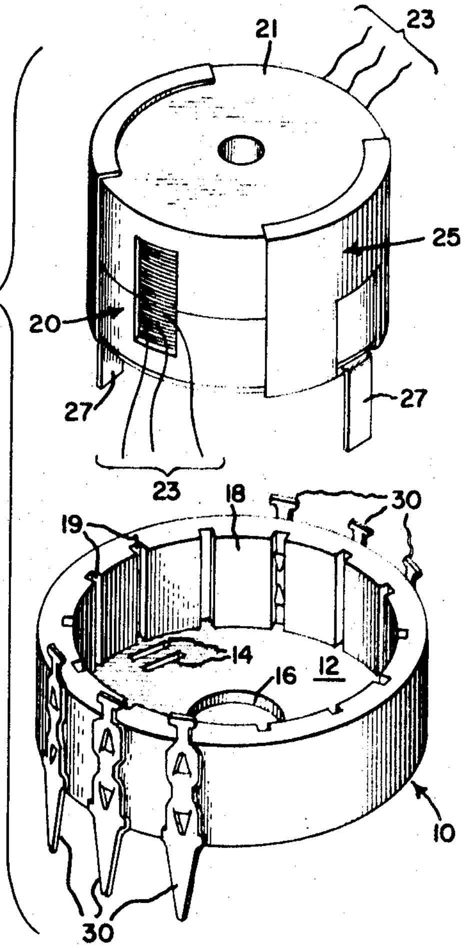
FIG. 3 shows a perspective view of my mounting device and a wound inductor to be placed in the mounting device.

With reference to FIG. 3, I show a perspective view of the mounting device 10 shown in FIGS. 1 and 2. The mounting device 10 of FIG. 3 is intended to receive and mount an inductor designated generally by the reference numeral 20. The inductor 20 is wound on a coil or bobbin and may be enclosed by a magnetic core 21. The inductor 20 may have one or more leads or wires 23. The inductor 20 of FIG. 3 is held in a suitable metallic clip 25, such as described and shown in U.S. Pat. No. 3,197,167. The clip 25 has a plurality of tabs or legs 27 extending downwardly for mounting the inductor 20 in the mounting device 10. When the inductor 20 in its clip 25 is to be mounted, it is placed in the open end 11 of the mounting device 10 so that the tabs 27 extend through appropriate ones of the holes 14. The tabs may then be twisted to retain the inductor 20 in the mounting device 10. The leads 23 may then be soldered or connected to longitudinal pins or terminals 30, which are fastened to the outer surface of the mounting device 10 by being staked or press fitted on the cylindrical portion of the device 10 at selected ones of the slots 19. Thus, the slots 19 serve as locators and reduce the thickness of the cylindrical portion at the point of staking. As shown in FIG. 3, the pins or terminals 30 are elongated flat metallic members that are suitably shaped at the top to receive a wire, and that are tapered at the bottom to facilitate passing through a hole in a printed circuit board. The tops of the pins or terminals 30 extend slightly above the open end 11 for receiving the leads 23 which may be connected by soldering. The pins or terminals 30 extend an appreciable distance beneath the bottom 12 of the device 10 to permit the device 10 to be attached to a printed circuit board.

Figure 4:
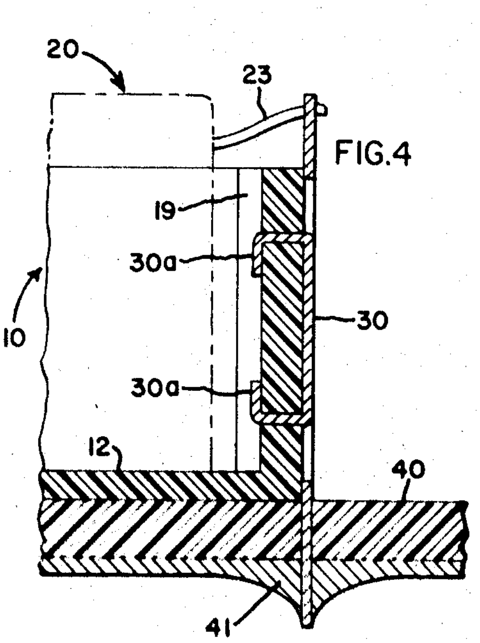
FIG. 4 shows a partial cross-sectional view of my mounting device when attached to a printed circuit board.

With reference to FIG. 4, I have shown a cross-sectional view of a portion of the member 10 with one of the pins or terminals 30 for attaching the member 10 to a printed circuit board 40. FIG. 4 also shows how the pins or terminals 30 are staked by tabs 30*a*, which extend through the member 10 and are bent or folded against the bottom of the slot 19. The inductor 20 is shown in phantom, with one of its leads 23 shown connected to the upper portion of the terminal 30. The printed circuit board 40 is provided with suitable holes or openings for receiving the lower portion of the pin or terminals 30 when the assembled mounting device 10 and inductor 20 are positioned on the printed circuit board 40. When the printed circuit board 40 is to be soldered, the solder that fastens the various components to the board 40 can also be used to fasten the pin 30 to the board 40 as indicated by the reference numeral 41. This provides a firm and secure attachment of the inductor 20 to the printed circuit board 40, without requiring additional features or arrangements.

It will thus be seen that my invention provides a new and improved device for mounting an inductor to a printed circuit board. My device can be provided with almost any number of pins or terminals, depending upon the particular inductor to be mounted. The inductor can be fastened to my device by means of the tabs described in connection with FIG. 3, or by means of cement, or by means of a machine screw. However the inductor is mounted, my device requires that the inductor leads be handled only once in soldering them to the pins or terminals. The inductor is then fastened and connected to a printed circuit board by means of my device without the inductor leads being utilized to provide mechanical strength. As will be appreciated by persons skilled in the art, any number of pins or terminals can be used with my device, so that an appropriate number of slots may be provided. While I prefer that the slots have equal spacings, this is not necessary. I also prefer a plastic insulating material, but other materials may be used. The bottom of my device may have various configurations, depending upon the exact arrangement of the inductor to be held by the device. Therefore, while my invention has been described with reference to a particular embodiment, it is to be understood that modifications may be made without departing from the spirit of the invention or from the scope of the claims.

What I claim as new and desire to secure by Letters Patent of the United States is:

1. A device for mounting a wound inductor on a printed circuit board comprising:

a. a cylindrical member formed of an electrically insulating material;

b. said cylindrical member being open at the upper end and being at least partially closed at the lower end to form a receptacle for a wound inductor;

c. said cylindrical member having a plurality of spaced depressions positioned on the inner surface of said cylindrical member; and d. terminals having staking tabs positioned on the outer surface of said cylindrical member and over said plurality of spaced depressions, each of said staking tabs passing through said cylindrical member and being bent over in a corresponding one of said plurality of spaced depressions.

2. The mounting device of claim 1 wherein said spaced depressions comprise parallel slots extending longitudinally along said inner surface of said cylindrical member.

3. The mounting device of claim 1 wherein said spaced depressions are substantially equally spaced around said cylindrical member.

4. The mounting device of claim 1 wherein said spaced depressions are substantially equally spaced around said cylindrical member, and wherein said spaced depressions comprise parallel slots extending longitudinally along said inner surface of said cylindrical member.

5. The mounting device of claim 4 wherein said cylindrical member and closed portion are integral.

6. The mounting device of claim 5 wherein said closed portion of said cylindrical member has openings therethrough for receiving mounting tabs.

7. An improved device for mounting a wound inductor and connecting the inductor leads to a printed circuit board comprising:

a. a cylindrical member formed of a single piece of electrically insulating material;

b. said member being open at one end, and being at least partially closed at the other end by a bottom to form a can-shaped receptacle for holding a wound inductor;

c. said member having a plurality of slots on the cylindrical inner surface thereof, said slots extending in a longitudinal and parallel direction between said one end and said other end of said member; and d. pins having staking tabs positioned on the outer surface of said cylindrical member and over said plurality of spaced slots, each of said staking tabs passing through said cylindrical member and being bent over in a corresponding one of said plurality of spaced slots.

8. The improved device of claim 7 wherein said slots are substantially equally spaced around said member.